United States Patent
Homola et al.

(10) Patent No.: US 9,553,210 B2
(45) Date of Patent: Jan. 24, 2017

(54) HIGH FREQUENCY POWER DIODE AND METHOD FOR MANUFACTURING THE SAME

(71) Applicant: ABB Schweiz AG, Baden (CH)

(72) Inventors: Jaroslav Homola, Kladno (CZ); Jiri Podzemsky, Most (CZ); Ladislav Radvan, Benesov (CZ); Ilja Muller, Prague (CZ)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 14/851,409

(22) Filed: Sep. 11, 2015

(65) Prior Publication Data

US 2016/0079441 A1  Mar. 17, 2016

(30) Foreign Application Priority Data

Sep. 15, 2014 (EP) .................................. 14184784

(51) Int. Cl.
*H01L 29/868* (2006.01)
*H01L 29/66* (2006.01)
(Continued)

(52) U.S. Cl.
CPC .......... *H01L 29/868* (2013.01); *H01L 21/223* (2013.01); *H01L 21/304* (2013.01); *H01L 29/167* (2013.01); *H01L 29/32* (2013.01); *H01L 29/6609* (2013.01)

(58) Field of Classification Search
CPC H01L 29/868; H01L 29/8611; H01L 29/6609; H01L 29/66121; H01L 29/66136; H01L 29/66128; H01L 21/223
See application file for complete search history.

(56) References Cited

U.S. PATENT DOCUMENTS 4,045,252 A * 8/1977 Moutou .............. H01L 21/2654
257/656
6,060,745 A * 5/2000 Tadokoro .......... H01L 29/66712
257/329
(Continued)

FOREIGN PATENT DOCUMENTS

| EP | 0193462 A1 | 9/1986 |
| FR | 2288390 A1 | 5/1976 |
| WO | 2013028973 A1 | 2/2013 |

OTHER PUBLICATIONS

European Search Report Application No. EP 14 18 4784 Completed: Mar. 13, 2015 3 pages.

*Primary Examiner* — Earl Taylor
(74) *Attorney, Agent, or Firm* — Whitmyer IP Group LLC

(57) ABSTRACT

High frequency power diode including a semiconductor wafer having first and second main sides, a first layer of a first conductivity type formed on the first main side, a second layer of a second conductivity type formed on the second main side and a third layer of the second conductivity type formed between the first layer and the second layer. The first layer has a dopant concentration decreasing from $10^{19}$ cm$^{-3}$ or more adjacent to the first main side of the wafer to $1.5 \cdot 10^{15}$ cm$^{-3}$ or less at an interface of the first layer with the third layer. The second layer has a dopant concentration decreasing from $10^{19}$ cm$^{-3}$ or more adjacent to the second main side of the wafer to $1.5 \cdot 10^{15}$ cm$^{-3}$ at an interface of the second layer with the third layer and the third layer has a dopant concentration of $1.5 \cdot 10^{15}$ cm$^{-3}$ or less.

22 Claims, 5 Drawing Sheets

(51) Int. Cl.
*H01L 29/167* (2006.01)
*H01L 21/223* (2006.01)
*H01L 21/304* (2006.01)
*H01L 29/32* (2006.01)

(56) References Cited

U.S. PATENT DOCUMENTS

| | | | | |
|---|---|---|---|---|
| 7,091,579 | B2* | 8/2006 | Nemoto | H01L 21/263 |
| | | | | 257/655 |
| 7,358,127 | B2* | 4/2008 | Nemoto | H01L 21/263 |
| | | | | 257/E21.051 |
| 9,209,027 | B1* | 12/2015 | Schmidt | H01L 21/265 |
| 2003/0057522 | A1* | 3/2003 | Francis | H01L 21/221 |
| | | | | 257/566 |
| 2003/0127645 | A1* | 7/2003 | Drobnis | H01L 29/167 |
| | | | | 257/44 |
| 2004/0041225 | A1* | 3/2004 | Nemoto | H01L 21/263 |
| | | | | 257/458 |
| 2007/0108558 | A1* | 5/2007 | Nemoto | H01L 29/36 |
| | | | | 257/655 |
| 2014/0159150 | A1* | 6/2014 | Kirisawa | H01L 29/66128 |
| | | | | 257/335 |
| 2014/0246761 | A1* | 9/2014 | Veeramma | H01L 29/8613 |
| | | | | 257/653 |
| 2016/0049474 | A1* | 2/2016 | Schmidt | H01L 29/1095 |
| | | | | 257/590 |
| 2016/0079441 | A1* | 3/2016 | Homola | H01L 29/868 |
| | | | | 257/653 |

* cited by examiner

HIGH FREQUENCY POWER DIODE AND METHOD FOR MANUFACTURING THE SAME

FIELD OF THE INVENTION

The present invention relates to a high frequency power diode as well as to a method for manufacturing such high frequency power diode.

BACKGROUND OF THE INVENTION

For resistance welding it is known to use welding diodes which are power semiconductor diodes as rectifier diodes. Resistance welding is a technique used for joining sheets of metal. Perhaps the most common application of resistance welding is spot welding in the manufacturing process of car bodies where many of the industrial robots found on assembly lines are spot welders. Resistance welding is a process in which contacting metal surfaces are joined by the heat obtained from resistance to electrical current. Accordingly, a key factor influencing the heat or welding temperature is the electrical current and the length of welding time. Small pools of molten metal are formed at the point of most electrical resistance (the connecting or "faying" surfaces) as a high electrical current in a range of several 1,000 A up to 100,000 A is passed through the metal.

Accordingly, the main feature of a welding diode is a high current capability in the above mentioned range of several 1,000 A up to 100,000 A combined with a low on-state voltage and a very low thermal resistance, while the required reverse voltage is relatively low, usually in the range of 200 V to 600 V.

A known welding diode is shown in cross section in FIG. 1f. It comprises a silicon wafer having a first main side 1 and a second main side 2 opposite to the first main side 1. In the wafer there is formed from its first main side 1 to its second main side 2: a highly doped p-type anode layer 3 adjacent to the first main side 1, a low-doped n-type base layer 4 and a highly doped n-type cathode layer 5 adjacent to the second main side 2 of the wafer. The anode layer 3, the base layer 4 and the cathode layer 5 form a pin diode structure. On the first main side 1 of the wafer there is formed an anode electrode 6 and on the second main side 2 of the wafer there is formed a cathode electrode 7.

In the following the manufacturing process for the known welding diode is described with reference to FIGS. 1a to 1f. The known welding diodes are diffused pin diodes manufactured by diffusion processes which is more cost efficient than manufacturing the welding diode by a more elaborate epitaxy process. Especially the epitaxial growth of an intrinsic or low doped layer of a pin diode structure is a critical and cost intensive process.

In a first process step for manufacturing the known welding diode the p-type dopants aluminium (Al) and boron (B) are diffused into a low-doped n-type silicon wafer 10 from all sides as shown in FIG. 1a. Therein, the diffusion of the p-type dopants Al and B is indicated by arrows. As a result of the first process step a highly doped p-type layer 13 on the first main side 1 of the wafer and another highly doped p-type layer 13' on the second main side of the wafer are formed as shown in FIG. 1b. The highly doped p-type layers 13 and 13' are separated by a low-doped n-type layer 14 formed by the material of the wafer 10. Thereafter the highly doped p-type layer 13' on the second main side 2 is removed by mechanical grinding of the wafer 10 in a second process step to form a thinned wafer having a thickness $W_1 < W_0$ as shown in FIG. 1c, wherein $W_0$ is the thickness of the wafer 10 before thinning in the second process step.

In a third process step shown in FIG. 1d the relatively thin highly doped n-type cathode layer 5 is formed by diffusion of phosphorous (P) as an n-type dopant into the low-doped n-type layer 14 of the thinned wafer from its second main side 2 while the first main side 1 of the thinned wafer is covered by a silicon oxide barrier layer 19 to prevent the n-type dopant P from diffusing into the highly doped p-type layer 13 during the third process step. In FIG. 1d the diffusion of P into the wafer is indicated by arrows.

After forming the highly doped n-type cathode layer 5 in the third process step, the silicon oxide barrier layer 19 is removed by etching to obtain the device as shown in FIG. 1e with the anode layer 3, the base layer 4 and the cathode layer 5. The last process steps of the known manufacturing method are the step of forming the anode electrode 6 on the anode layer 3 and the step of forming the cathode electrode 7 on the cathode layer 5 to arrive at the known welding diode as shown in FIG. 1f.

In the known manufacturing process for a welding diode there are certain limitations regarding the thickness $W_2$ of the anode layer 3, the thickness $W_3$ of the base layer 4 and the thickness $W_4$ of the cathode layer 5.

The thickness of the first highly doped p-type layer 13 and therefore also the thickness of the anode layer 3 in the final device is limited by the mechanical stability of the wafer due to the fact that the second highly doped p-type layer 18 has to be removed by grinding. The thicker the first highly doped p-type layer 13 is, the thinner the thinned wafer shown in FIG. 1c must be.

Furthermore, the thickness $W_4$ of the cathode layer 5 is mainly limited by the fact that the blocking function of the silicon oxide barrier layer 19 is limited in time. After a certain time the n-type dopant would diffuse also through the silicon oxide barrier layer 19 into the first highly doped p-type layer 13. Another limiting factor for the diffusion depth of the cathode layer 5 is the fact that not only the n-type dopant but also the p-type dopants of the first highly doped p-type layer 13 move and spread by diffusion during the third process step for forming the cathode layer 5.

As a result of the above limitations the known welding diodes have a thickness $W_3$ of the base layer 4 of about 100 μm or more.

In FIG. 2 there is shown the doping profile of a known welding diode, i.e. the dopant concentration from the first main side 1 to the second main side 2 of the wafer. Therein the distance from the wafer surface means the distance from the first main surface of the silicon wafer. There is also shown in FIG. 2 the carrier concentration in the base layer 4 under forward biasing conditions. As a result of high level injection the concentration of electrons n equals the concentration of holes p in the base layer 4 in the welding diode under forward biasing conditions. In FIG. 2 dotted curve 25 represents the carrier concentration n=p without electron irradiation of the known welding diode, and dashed curve 26 represents the carrier concentration n=p after electron irradiation of the known welding diode. Electron irradiation is a known means for reducing carrier lifetime by inducing deep level traps acting as recombination centers in the silicon wafer.

For a low on-state voltage the conductivity and, therefore, also the carrier concentration n=p in the base layer 4 should be as high as possible. However, the high carrier concentration n=p in the base layer 4 also results in a high reverse recovery charge Qrr, which basically corresponds to the area under the curve representing the carrier concentration (i.e.

the area under dotted curve 25 or dashed curve 26 in FIG. 2). At high frequencies a high reverse recovery charge Qrr and a high minority carrier lifetime result in high switching losses. In the known welding diode, electron irradiation would reduce the switching losses by reducing both the reverse recovery charge Qrr and the carrier lifetime. However, as can be seen from a comparison of dotted curve 25 and dashed curve 26, the electron irradiation results at the same time in a significantly reduced carrier concentration n=p in the base layer 4 and, therefore, in a significantly increased on-state voltage. As the switching losses are a limiting factor for increasing the operational frequency of a diode, the known welding diodes are not appropriate for frequencies above about 1 kHz.

SUMMARY OF THE INVENTION

It is the object of the invention to provide a high frequency power diode for resistance welding (i.e. a welding diode) which can be used at high frequencies of 10 kHz or more with a low on-state voltage and a high current capability. Also it is the object of the invention to provide a manufacturing method for such high frequency power diode.

The object is attained by a high frequency power diode according to the invention.

In the high frequency power diode, the thickness of the third layer separating the highly doped first layer from the highly doped second layer of another conductivity type is less than 60 µm. Therefore, the reverse recovery charge is low and the high frequency power diode can be used as a rectifier diode at frequencies of 10 kHz and more. With the use of the high frequency power diode, equipment for resistance welding can be operated at higher frequencies. That has the benefit that smaller transformers can be used in the welding equipment. Accordingly, the benefit is lower costs, less space and a lower weight of the welding equipment.

Further developments of the invention are specified in the dependent claims.

In a preferred embodiment, the first layer and the second layer each have a surface doping concentration of at least $7 \cdot 10^{19}$ cm$^{-3}$. Such high doping concentration ensures a very low on-state voltage.

In a preferred embodiment, the semiconductor wafer has a thickness of 150 µm or more. An advantage of that feature is that the wafer has a good mechanical stability.

In a preferred embodiment the device comprises deep-level traps as recombination centers to decrease the carrier lifetime. In the known welding diode with a thickness of the low-doped n-type layer of about 100 µm or more, the deep-level traps result in a higher on-state voltage due to lowering the carrier concentration in the low-doped n-type layer under forward biasing conditions as discussed above. Contrary thereto, the deep-level traps in a high frequency power diode according to the invention do not result in a significant lowering of the carrier concentration in the third layer separating the highly doped first layer from the highly doped second layer. Accordingly, deep-level traps can be used in the invention to further improve the reverse recovery and to decrease the switching losses at high frequencies without sacrificing the low on-state voltage.

In a preferred embodiment, the device comprises electron irradiation induced traps. Electron irradiation is an easy, fast and cost efficient way to generate deep-level traps in the device.

The object is also attained by a method for manufacturing the high frequency power diode according to the invention.

The method of the invention has the advantage that the simultaneous diffusion of the first conductivity type dopant into the semiconductor wafer from its first main side and of the second conductivity type dopant into the semiconductor wafer from its second main side allows to form not only a deep diffused anode layer but also a deep diffused cathode layer to manufacture a diffused pin diode structure with diffused anode and cathode layers with a thin base layer of less than 60 µm.

In a preferred embodiment the surface concentration of the first conductivity type dopant at the first main side and the surface concentration of the second conductivity type dopant at the second main side are kept constant during the step (b) of simultaneous diffusion of the anode layer and of the cathode layer. The feature has the advantage that a maximum doping level can be achieved with a good process control.

In a preferred method, the method comprises further the step of thinning the semiconductor wafer to a thickness between 150 and 250 µm before the step (b) of simultaneous diffusion. That feature has the advantage that the necessary diffusion depth can be lowered and that the on-state voltage of the final device can be lowered without sacrificing the mechanical stability of the semiconductor wafer.

BRIEF DESCRIPTION OF THE DRAWINGS

Detailed embodiments of the invention will be explained below with reference to the accompanying figures, in which:

FIGS. 1a-1f illustrate the manufacturing process for manufacturing a known welding diode in cross section, wherein FIG. 1f shows the finally manufactured known welding diode;

FIGS. 3a-3e illustrate the manufacturing process for manufacturing a high frequency power diode according to an embodiment of the invention in cross section, wherein FIG. 3e shows the finally manufactured welding diode according to an embodiment of the invention.

DETAILED DESCRIPTION OF THE INVENTION

Figure 3A:
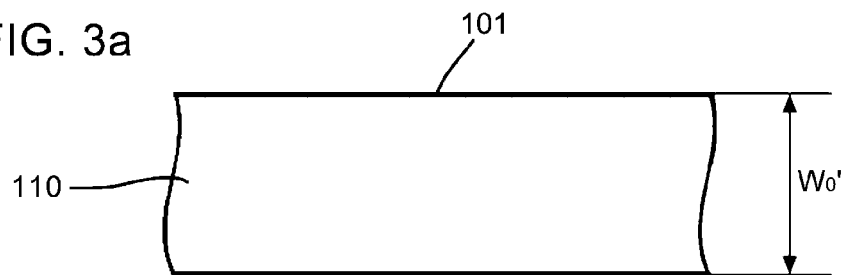
Figure 3B:
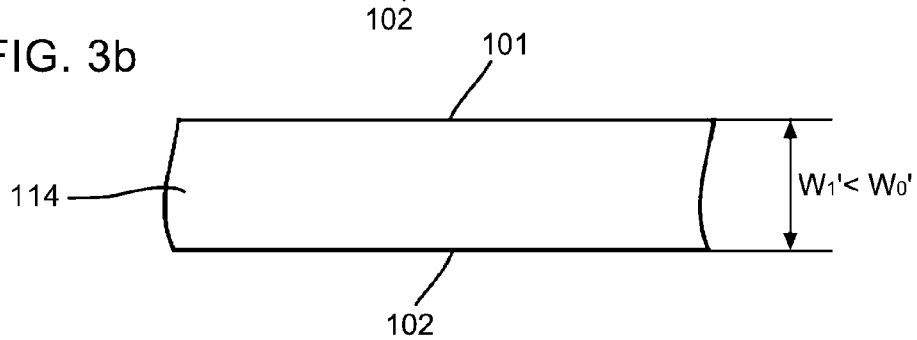
Figure 3C:
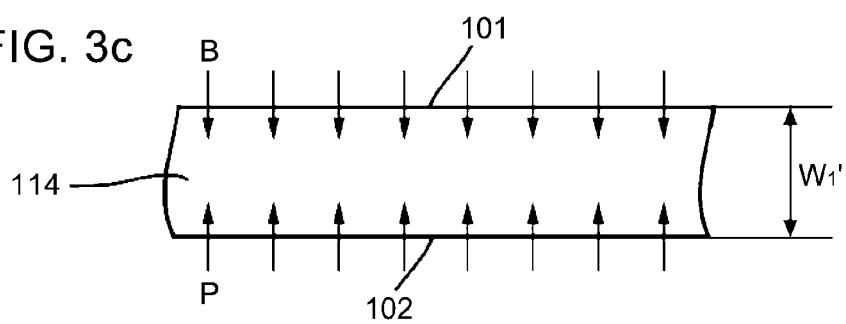
Figure 3D:
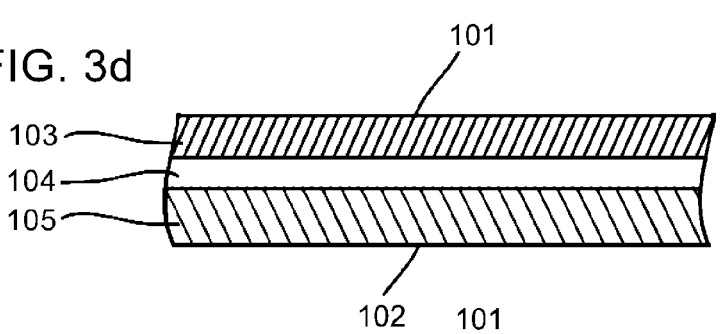
Figure 3E:
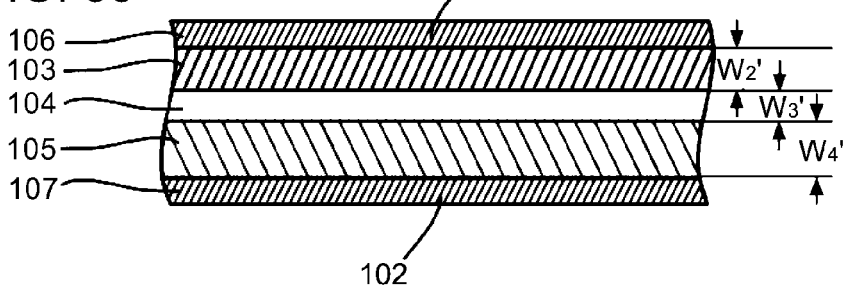

In FIG. 3e there is shown a high frequency power diode according to an embodiment of the invention in cross section. The high frequency power high diode shown in FIG. 3e comprises a silicon wafer having a first main side 101 and a second main side 102 opposite to the first main side 101. The silicon wafer has a thickness in a direction orthogonal to the first and second main side of about 200 µm and a diameter in a direction parallel to the first and second main side of about 50 mm.

In the wafer there is formed from its first main side 101 to its second main side 102: a highly doped p-type anode layer 103 adjacent to the first main side 101, a low-doped n-type base layer 104 and a highly doped n-type cathode layer 105 adjacent to the second main side 102 of the wafer. The anode layer 103, the base layer 104 and the cathode layer 105 form a pin diode structure. On the first main side 101 of the wafer there is formed an anode electrode 106 and on the second main side 102 of the wafer there is formed a cathode electrode 107.

The anode layer 103 is intentionally doped with boron (B) as a p-type dopant. The concentration of boron in the anode layer 103 is decreasing from a concentration of $10^{19}$ cm$^{-3}$ or more, preferably of $7 \cdot 10^{19}$ cm$^{-3}$ or more, adjacent to the first main side 101 of the wafer to a concentration of $1.5 \cdot 10^{15}$ cm$^{-3}$ or less at an interface of the anode layer 103 with the base layer 104. The cathode layer 105 is intentionally doped with phosphorous (P) as an n-type dopant. The concentration of phosphorous in the cathode layer 105 is decreasing from a concentration of $10^{19}$ cm$^{-3}$ or more, preferably of $7 \cdot 10^{19}$ cm$^{-3}$ or more, adjacent to the second main side 102 of the wafer to a concentration of $1.5 \cdot 10^{15}$ cm$^{-3}$ or less at an interface of the cathode layer 105 with the base layer 104. The base layer 104 is lightly doped with phosphorous as an n-type dopant with a doping concentration of $1.5 \cdot 10^{15}$ cm$^{-3}$ or less.

The doping concentration profile of boron in the anode layer 103 and the concentration profile of phosphorous in the cathode layer 105 is one generated by simultaneous deep diffusion of boron into the wafer from the first main side and of phosphorous into the wafer through the second main side. The diffusion depth of boron in the anode layer 103 and the diffusion depth of phosphorous in the cathode layer 105 is characterized by a concentration of boron in the anode layer 103 at a distance of 50 µm from the first main side 101 and a concentration of phosphorous in the cathode layer 105 at a distance of 50 µm from the second main side of $10^{17}$ cm$^{-3}$ or more, respectively. The thickness $W_3'$ of the base layer 104 in the present embodiment of the invention is less than 60 µm. In the present embodiment this means that the thickness $W_3'$ of base layer 104 is less than two ambipolar diffusion lengths. The low thickness of the base layer 104 is attained in the present invention by a deep diffused anode layer 103 and deep diffused cathod layer 105, the thickness $W_2'$ and $W_4'$ of which is at least more than 50 µm.

In addition the semiconductor wafer of the high frequency power diode of the present embodiment comprises deep-level traps as recombination centers to decrease the carrier lifetime. More specifically, in the present embodiment the deep-level traps are electron irradiation induced traps.

Figure 1A:
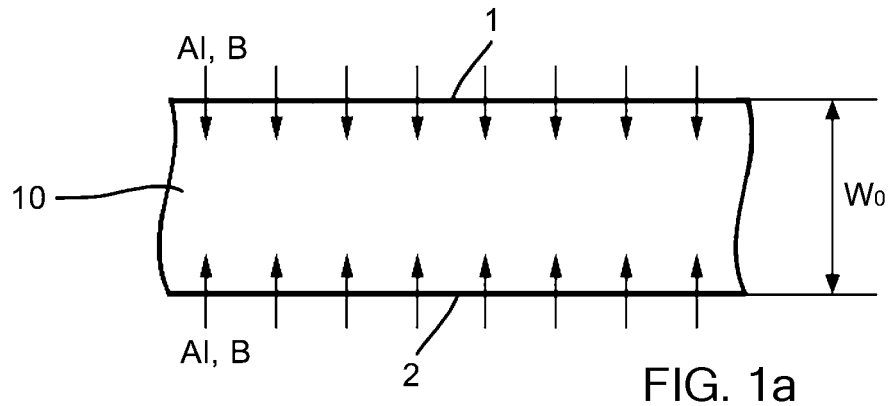
Figure 1B:
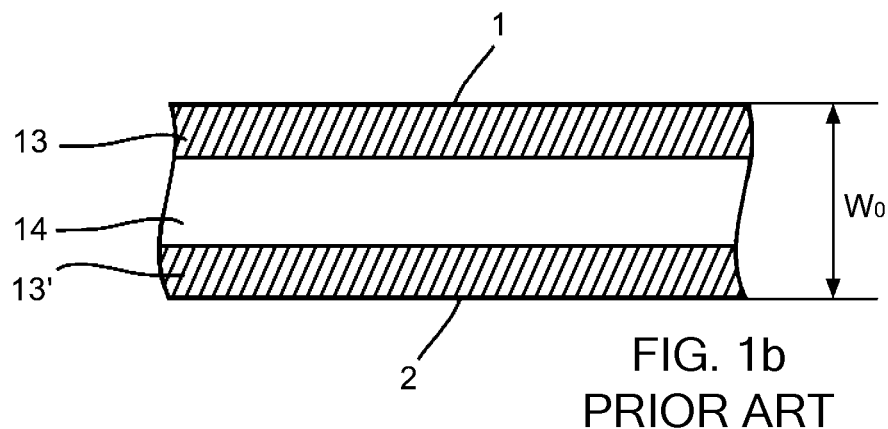
Figure 1C:
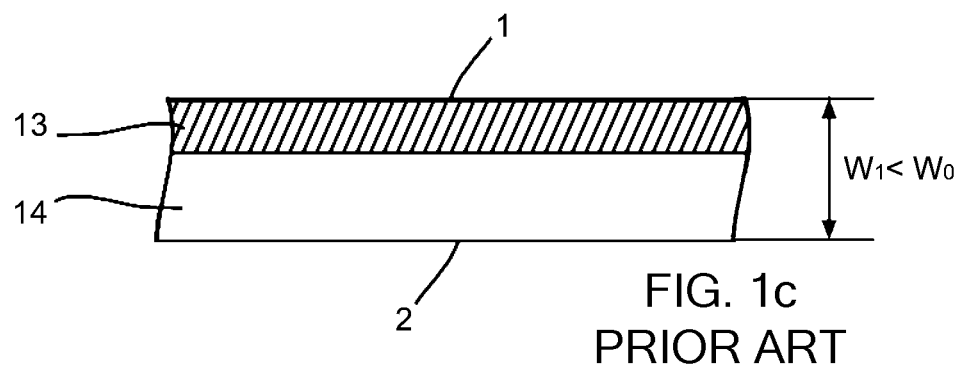
Figure 1D:
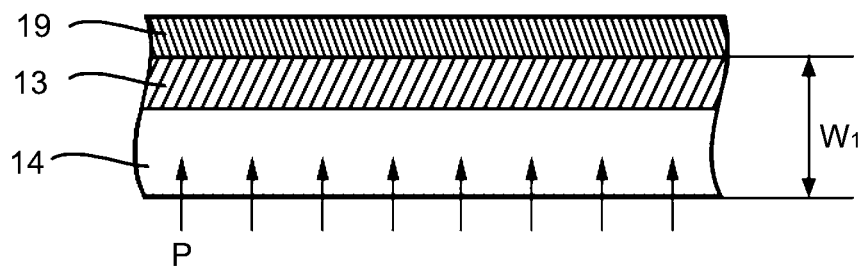
Figure 1E:
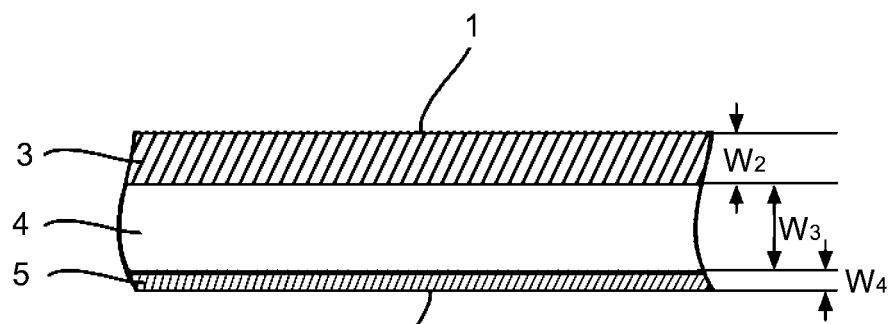
Figure 1F:
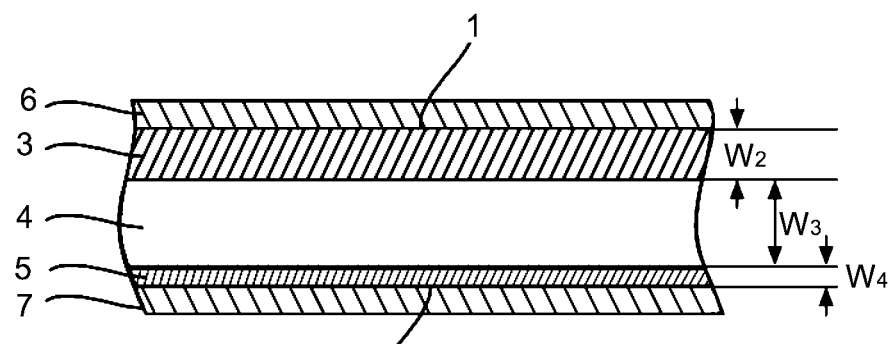
Figure 2:
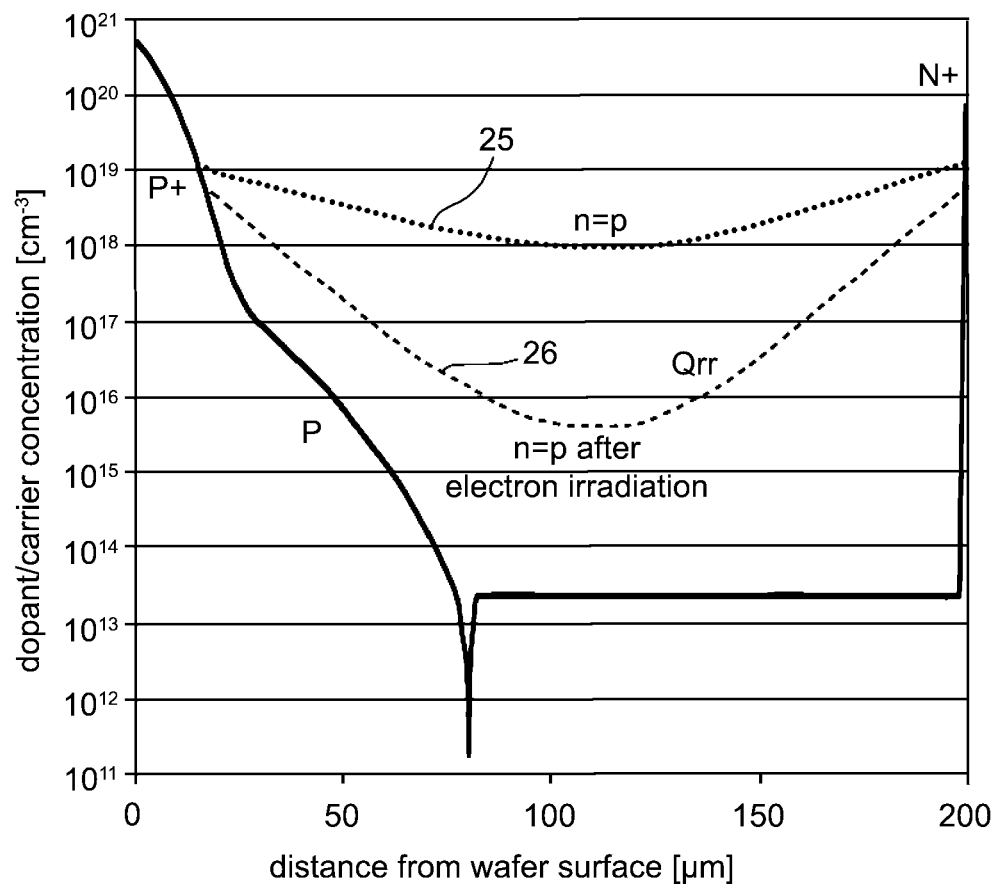
FIG. 2 shows the dopant concentration profile of the known welding diode shown in FIG. 1f and the carrier concentration in the base layer thereof under forward biasing conditions.
Figure 4:
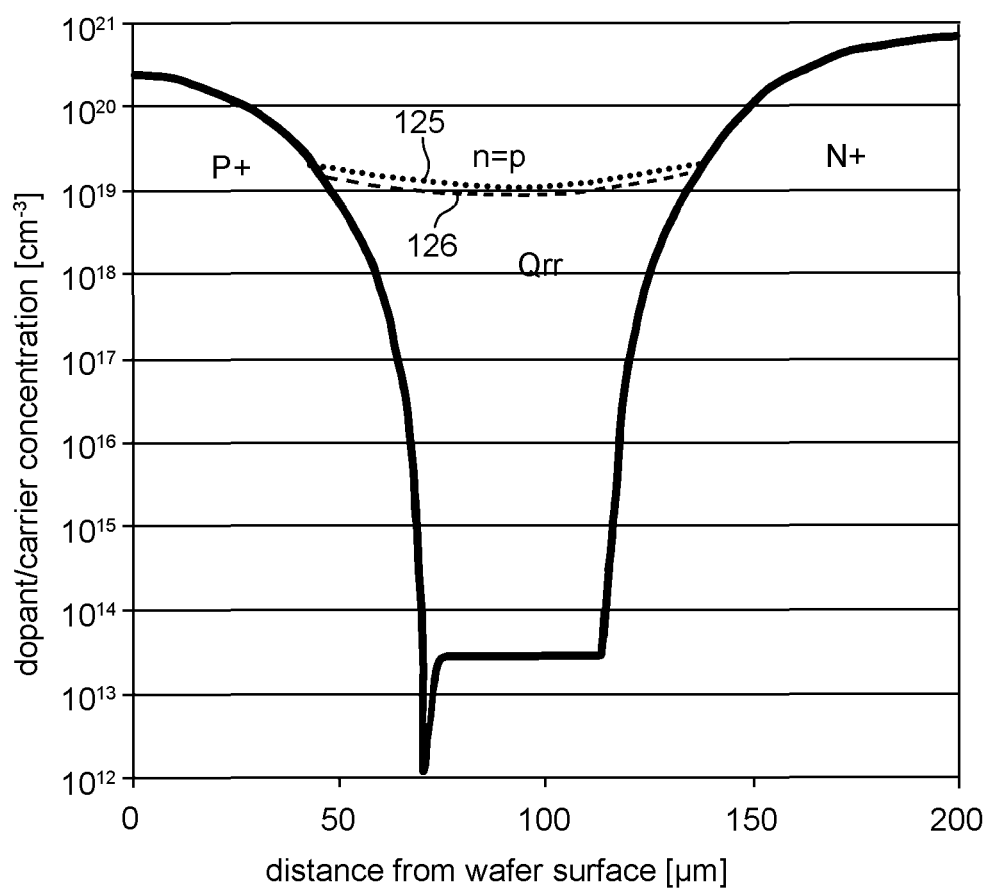
FIG. 4 shows the dopant concentration profile of the welding diode shown in FIG. 3e and the carrier concentration in the base layer thereof under forward biasing conditions.

In FIG. 4 there is shown the doping profile of the high frequency power diode of the present embodiment from the first main surface 101 of the silicon wafer to the second main surface 102 of the silicon wafer. In FIG. 4 the distance from the wafer surface means the distance from the first main surface 101 of the silicon wafer. The bold line represents the concentration of boron in the anode layer 103 and of phosphorous in the base layer 104 and in the cathode layer 105. Dotted curve 125 represents the carrier concentration n=p in the base layer 104 under forward biasing conditions of the high frequency power diode without electron irradiation induced deep level traps, whereas dashed curve 126 represents the carrier concentration n=p under forward biasing conditions of the high frequency power diode with electron irradiation induced deep level traps. As in the known welding diode discussed with FIGS. 1 and 2, under forward biasing conditions the concentration of electrons n equals the concentration of holes p in the base layer 104 because of high-level injection conditions. As can be seen from a comparison of the curves 125 and 126 the electron irradiation induced deep level traps do not have a significant effect on the carrier concentration due to the small thickness $W_3'$ of the base layer which is less than 60 µm. Therefore, in the high frequency power diode of the invention, carrier lifetime and accordingly also switching losses can be reduced without significant adverse effect on the on-state voltage.

Next there will be described with reference to FIGS. 3a to 3e a manufacturing method for manufacturing the high frequency power diode shown in FIG. 3e according to an embodiment of the invention.

In a first process step a silicon wafer 110 which is lightly doped with phosphorous as an n-type dopant with a dopant concentration of $1.5 \cdot 10^{15}$ cm$^{-3}$ or less is thinned from its original thickness $W_0'$ as shown in FIG. 3a down to a thickness $W_1' < W_0'$ as shown in FIG. 3b. In the present embodiment, the thickness $W_0'$ of the silicon wafer 110 is 279 µm±25 µm and the diameter of the silicon wafer is about 50 mm. The thickness $W_1'$ of the wafer 114 after thinning is in the present embodiment about 200 µm.

In the process step shown in FIG. 3c there is simultaneously diffused boron (B) as a p-type dopant into the thinned silicon wafer 114 from its first main side 101 and phosphorous (P) as an n-type dopant into the thinned silicon wafer 114 from its second main side 102. Therein, diffusion of dopant into the semiconductor wafer is to be understood as diffusion from outside of the wafer into the wafer, that is the dopant or a dopant precursor is supplied from outside during the diffusion step. In the present embodiment, the diffusion is carried out from the gas phase, where a carrier gas is enriched with a precursor for the desired dopant also in gaseous form (e.g. phosphine $PH_3$ for phosphorous and diborane $B_2H_6$ for boron). During the simultaneous diffusion it must be ensured that the source for boron comes into contact only with the first main side 101 of the thinned silicon wafer 114 but does not come into contact with the second main side 102 of the thinned silicon wafer 114, while it must be also ensured that the source for phosphorous comes into contact only with the second main side 102 of the thinned silicon wafer 114 but does not come into contact with the first main side 102 of the thinned silicon wafer 114. The diffusion is performed at a high temperature in a range of 900° C. to 1400° C. for several tens of hours to obtain a deep diffusion profile for both boron and phosphorous as characterized above with reference to FIG. 3e. Preferably, the diffusion is performed with a constant surface concentration of the dopants which is also known as the "constant surface concentration condition" in which the concentration of dopants near to the surface of the wafer is kept constant by a continuous supply of dopants from outside.

After the step of simultaneous diffusion of boron into the thinned silicon wafer 114 from its first main side 101 and of phosphorous into the thinned silicon wafer 114 from its second main side 102, an anode electrode 106 is formed on the anode layer 103 and a cathode electrode 107 is formed on the cathode layer 105 to obtain the high frequency power diode shown in FIG. 3e.

As a further process step the high frequency power diode is irradiated with electrons to generate deep-level defects in the silicon wafer for decreasing the carrier lifetime. Preferably the whole active region of the wafer is subjected to electron irradiation.

It will be apparent for persons skilled in the art that modifications of the above described embodiments are possible without departing from the idea of the invention as defined by the appended claims.

In the above described embodiments phosphorous was used as the preferred n-type dopant for the base layer 104 as well as for the cathode layer 105. However, it is also possible to use any other kind of n-type dopant, such as arsenic (As) or antimony (Sb) or bismuth (Bi), for these layers or to use even more than one kind of n-type dopant. Exemplarily, the base layer may be doped with another n-type dopant than the cathode layer. The base layer may also be formed of NTD (Neutron Transmutation Doped) silicon, for example. In the claims the first conductivity type dopant concentration refers to the total concentration of all dopants which act as a first conductivity type dopant. Likewise the second conductivity type dopant concentration refers to the total concentration of all dopants which act as a second conductivity type dopant.

In the above described embodiments, the base layer 104 of the high frequency power diode and the silicon wafer 110 used for manufacturing such high frequency power diode was intentionally doped with phosphorous as an n-type dopant. However, the base layer in the high frequency power diode of the invention may also be an intrinsic semiconductor layer or may even be a low-doped p-type layer as long as the doping concentration in the base layer is $1.5 \cdot 10^{15}$ cm$^{-3}$ or less.

In the above described embodiment the high frequency power diode was described with a silicon wafer having a thickness of 200 μm and a diameter of about 50 mm. However, the dimensions of the silicon wafer are not limited to such values. In another embodiment, the silicon wafer may have any other thickness, preferably above 150 μm, and any other diameter, preferably above 25 mm.

The embodiment of the high frequency power diode was described above with a silicon wafer. However, another semiconductor material, such as germanium for example, might be used for the high frequency power diode and for the method of manufacturing such high frequency power diode.

In the above embodiment of a manufacturing method for the high frequency power diode the simultaneous diffusion was performed from a gaseous source. However, the diffusion also be performed with a solid source where solid slices which contain the dopant are put into contact with the silicon wafer, or the diffusion can be performed with a liquid source (e.g. boron bromide BBr$_3$ for boron and phosphoryl chloride POCl$_3$ for phosphorous). It is also possible to use any combination of gaseous, solid or liquid sources during the simultaneous diffusion.

It should be noted that the term "comprising" does not exclude other elements or steps and that the indefinite article "a" or "an" does not exclude the plural. Also elements described in association with different embodiments may be combined.

What is claimed is:

1. A high frequency power diode, comprising:
   a semiconductor wafer having a first main side and a second main side opposite to the first main side;
   a first layer formed in the semiconductor wafer adjacent to the first main side, the first layer having a first conductivity type which is either n- or p-type conductivity;
   a second layer formed in the semiconductor wafer adjacent to the second main side, the second layer having a second conductivity type which is either n- or p-type conductivity but different from the first conductivity type;
   a third layer formed in the semiconductor wafer between the first layer and the second layer the third layer having the second conductivity type;
   wherein the first layer has a first conductivity type dopant concentration decreasing from $10^{19}$ cm$^{-3}$ or more adjacent to the first main side of the wafer to $1.5 \cdot 10^{15}$ cm$^{-3}$ or less at an interface of the first layer with the third layer;
   wherein the second layer has a second conductivity type dopant concentration decreasing from $10^{19}$ cm$^{-3}$ or more adjacent to the second main side of the wafer to $1.5 \cdot 10^{15}$ cm$^{-3}$ at an interface of the second layer with the third layer;
   wherein the third layer has a second conductivity type dopant concentration of $1.5 \cdot 10^{15}$ cm$^{-3}$ or less; and
   wherein the first conductivity type dopant concentration in the first layer at a distance of 50 μm from the first main side and the second conductivity type dopant concentration in the second layer at a distance of 50 μm from the second main side is $10^{17}$ cm$^{-3}$ or more, respectively, and the thickness of the third layer is less than 60 μm.

2. The high frequency power diode according to claim 1, wherein the first layer and the second layer each have a surface doping concentration of at least $7 \cdot 10^{19}$ cm$^{-3}$.

3. The high frequency power diode according to claim 1, wherein phosphorous is a second conductivity type dopant in the second layer.

4. The high frequency power diode according to claim 1, wherein boron is a first conductivity type dopant in the first layer.

5. The high frequency power diode according to claim 1, wherein the semiconductor wafer is a silicon wafer.

6. The high frequency power diode according to claim 1, wherein the semiconductor wafer has a thickness of 150 μm or more.

7. The high frequency power diode according to claim 1, wherein a doping concentration profile is generated by simultaneous diffusion of a first conductivity type dopant into the first main side and of a second conductivity type dopant into the second main side.

8. The high frequency power diode according to claim 1, comprising recombination centers to decrease the carrier lifetime.

9. The high frequency power diode according to claim 1, comprising electron irradiation induced traps.

10. The high frequency power diode according to claim 1, wherein the thickness of the third layer is less than two ambipolar diffusion lengths.

11. A method for manufacturing a high frequency power diode, the method comprising:
    (a) providing a semiconductor wafer having a first main side and a second main side; and
    (b) diffusing a first conductivity type dopant into the semiconductor wafer from its first main side and a second conductivity type dopant into the semiconductor wafer from its second main side while keeping respective surface concentrations of the first main side and second main side constant during the diffusing step.

12. The method according to claim 11, further comprising a step of thinning the semiconductor wafer to a thickness between 150 and 250 μm.

13. The method according to claim 11, further comprising a step of forming recombination centers in the semiconductor wafer.

14. The method according to claim 13, wherein the recombination centers are induced by electron irradiation of the semiconductor wafer.

15. A method for manufacturing a high frequency power diode, the method comprising:
    (a) providing a semiconductor wafer having a first main side and a second main side; and
    (b) diffusion of a first conductivity type dopant into the semiconductor wafer from its first main side and the diffusion of a second conductivity type dopant into the second main side of the semiconductor wafer occurring at least substantially at the same time.

16. The method according to claim 11, further comprising a step of forming a base layer in the semiconductor wafer.

17. The method according to claim 11, the diffusing step including doping the semiconductor wafer using a carrier gas enriched with a precursor for a desired dopant in gaseous form.

18. The method according to claim 15, further comprising a step of thinning the semiconductor wafer to a thickness between 150 and 250 µm.

19. The method according to claim 15, further comprising a step of forming recombination centers in the semiconductor wafer.

20. The method according to claim 19, wherein the recombination centers are induced by electron irradiation of the semiconductor wafer.

21. The method according to claim 15, further comprising a step of forming a base layer in the semiconductor wafer.

22. The method according to claim 15, the diffusing step including doping the semiconductor wafer using a carrier gas enriched with a precursor for a desired dopant in gaseous form.

* * * * *